(12) United States Patent  (10) Patent No.: US 8,149,144 B2
Mittal et al.  (45) Date of Patent: Apr. 3, 2012

(54) HYBRID ARITHMETIC-COMBINATORIAL ENCODER

(75) Inventors: Udar Mittal, Bangalore (IN); James P. Ashley, Naperville, IL (US); Tenkasi V. Ramabadran, Naperville, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 265 days.

(21) Appl. No.: 12/651,303

(22) Filed: Dec. 31, 2009

(65) Prior Publication Data

US 2011/0156932 A1 Jun. 30, 2011

(51) Int. Cl.
*H03M 7/38* (2006.01)
(52) U.S. Cl. .......................................... 341/51; 704/500
(58) Field of Classification Search ................... 341/51, 341/56, 107, 86; 704/201, 500, 222, 225; 708/200, 400
See application file for complete search history.

(56) References Cited

U.S. PATENT DOCUMENTS

| | | | |
|---|---|---|---|
| 4,560,977 A | 12/1985 | Murakami et al. | |
| 4,670,851 A | 6/1987 | Murakami et al. | |
| 4,727,354 A | 2/1988 | Lindsay | |
| 4,853,778 A | 8/1989 | Tanaka | |
| 5,006,929 A | 4/1991 | Barbero et al. | |
| 5,067,152 A | 11/1991 | Kisor et al. | |
| 5,327,521 A | 7/1994 | Savic et al. | |
| 5,692,102 A | 11/1997 | Pan | |
| 5,729,655 A | 3/1998 | Kolesnik et al. | |
| 6,236,960 B1 | 5/2001 | Peng et al. | |
| 6,263,312 B1 | 7/2001 | Kolesnik et al. | |
| 6,304,196 B1 | 10/2001 | Copeland et al. | |
| 6,445,686 B1 | 9/2002 | Hoffbeck et al. | |
| 6,453,287 B1 | 9/2002 | Unno et al. | |
| 6,504,877 B1 | 1/2003 | Lee | |
| 6,662,154 B2 | 12/2003 | Mittal et al. | |
| 6,813,602 B2 | 11/2004 | Thyssen | |
| 6,940,431 B2 | 9/2005 | Hayami | |
| 6,975,253 B1 | 12/2005 | Dominic | |
| 7,031,493 B2 | 4/2006 | Fletcher et al. | |
| 7,161,507 B2 | 1/2007 | Tomic | |
| 7,230,550 B1 | 6/2007 | Mittal et al. | |
| 7,231,091 B2 | 6/2007 | Keith | |
| 7,414,549 B1 | 8/2008 | Yang et al. | |
| 7,461,106 B2 | 12/2008 | Mittal et al. | |
| 7,864,086 B2 * | 1/2011 | Monro | 341/107 |
| 7,889,103 B2 | 2/2011 | Mittal et al. | |
| 2001/0033699 A1 | 10/2001 | Eshiraghian | |
| 2002/0015415 A1 | 2/2002 | Sugino et al. | |
| 2002/0052734 A1 | 5/2002 | Unno et al. | |
| 2004/0141572 A1 | 7/2004 | Johnson et al. | |
| 2004/0252768 A1 | 12/2004 | Suzuki et al. | |

(Continued)

OTHER PUBLICATIONS

Patent Cooperation Treaty, "PCT Search Report and Written Opinion of the International Searching Authority" for International Application No. PCT/US2010/061714, Jun. 29, 2011, 15 pages.

(Continued)

*Primary Examiner* — Joseph Lauture
(74) *Attorney, Agent, or Firm* — Philip A. Premysler; Sylvia Chen (57) ABSTRACT

Hybrid range coding/combinatorial coding (FPC) encoders and decoders are provided. Encoding and decoding can be dynamically switched between range coding and combinatorial according to the ratio of ones to the ratio of bits in a partial remaining sequence in order to reduce the computational complexity of encoding and decoding.

16 Claims, 8 Drawing Sheets

U.S. PATENT DOCUMENTS

| | | |
|---|---|---|
| 2005/0055203 A1 | 3/2005 | Makinen et al. |
| 2006/0022374 A1 | 2/2006 | Chen et al. |
| 2009/0019071 A1 | 1/2009 | Monro |
| 2009/0024398 A1 | 1/2009 | Mittal et al. |
| 2009/0100121 A1 | 4/2009 | Mittal et al. |
| 2009/0112607 A1 | 4/2009 | Ashley et al. |
| 2009/0234642 A1 | 9/2009 | Mittal et al. |
| 2009/0259477 A1 | 10/2009 | Ashley et al. |
| 2010/0088090 A1 | 4/2010 | Ramabadran |
| 2010/0169087 A1 | 7/2010 | Ashley et al. |
| 2010/0169099 A1 | 7/2010 | Ashley et al. |
| 2010/0169100 A1 | 7/2010 | Ashley et al. |
| 2010/0169101 A1 | 7/2010 | Ashley et al. |
| 2011/0096830 A1 | 4/2011 | Ashley et al. |

OTHER PUBLICATIONS

Ratko V. Tomic, "Quantized Indexing: Background Information", 1stWorks Corporation Technical Report TR05-0625, Jun. 25, 2005, pp. 1-39, XP002535774.

Udar Mittal et al., "Coding Pulse Sequences Using a Combination of Factorial Pulse Coding and Arithmetic Coding", 2010 IEEE Int'l Conf. on Signal Processing and Comm. (SPCOM), Jul. 18, 2010, pp. 1-5, XP031744814.

Andy C. Hung et al., "Error-Resilient Pyramid Vector Quantization for Image Compression", IEEE Transactions on Image Processing, Oct. 1998, pp. 1373-1386, vol. 7 No. 10.

Patent Cooperation Treaty, "PCT Search Report and Written Opinion of the International Searching Authority" for International Application No. PCT/US2009/036479, Jul. 28, 2009, 15 pages.

Tassos Markas and John Reif, "Multispectral Image Compression Algorithms", IEEE Data Compression Conf., Mar. 30-Apr. 2, 1993, pp. 391-400.

3rd Generation Partnership Project 2 (3GPP2), "Enhanced Variable Rate Codec, Speech Service Options 3, 68, and 70 for Wideband Spread Spectrum Digital Systems", 3GPP2 C. S0014-C version 1.0, Jan. 2007, 5 pages, XP002510839.

United States Patent and Trademark Office, "Notice of Allowance and Fee(s) Due" for U.S. Appl. No. 12/047,586, Nov. 20, 2009, 7 pages.

Patent Cooperation Treaty, "PCT Search Report and Written Opinion of the International Searching Authority" for International Application No. PCT/US2009/036481, Jul. 20, 2009, 15 pages.

Boris Ya. Ryabko and Elena Matchikina, "Fast and Efficient Construction of an Unbiased Random Sequence", IEEE Transactions on Info. Theory, May 2000, pp. 1090-1093, vol. 46 No. 3.

Ido Tal et al., "On Row-by-Row Coding for 2-D Constraints", IEEE Int'l Symp. on Info. Theory (ISIT), Jul. 9-14, 2006, pp. 1204-1208.

United States Patent and Trademark Office, "Non-Final Rejection" for U.S. Appl. No. 12/047,632, Mar. 2, 2011, 40 pages.

Norman Abramson, "Some Properties of Codes", Information Theory and Coding, 1963, pp. 61-62, McGraw-Hill, Hill, New York.

Christopher B. Jones, "An Efficient Coding System for Long Source Sequences," IEEE Transactions on Info. Theory, May 1981, pp. 280-291, vol. IT-27 No. 3.

Patent Cooperation Treaty, "PCT Search Report and Written Opinion of the International Searching Authority" for International Application No. PCT/US2009/058779, Feb. 16, 2010, 17 pages.

Christopher M. Garrido et al., "Towards iLBC Speech Coding at Lower Rates Through a New Formulation of the Start State Search", IEEE Proceedings of Int'l Conf. on Acoustics, Speech, and Signal Processing (ICASSP), Mar. 18, 2005, pp. 769-772, vol. 1.

Ralf Geiger et al., "ISO/IEC MPEG-4 High-Definition Scalable Advanced Audio Coding", J. of the Audio Engineering Soc'y, Jan. 2007, pp. 27-43, vol. 5 No. 1/2.

United States Patent and Trademark Office, "Non-Final Rejection" for U.S. Appl. No. 12/247,440, Apr. 22, 2011, 19 pages.

Patent Cooperation Treaty, "PCT Search Report and Written Opinion of the International Searching Authority" for International Application No. PCT/US2008/077321, May 28, 2009, 13 pages.

Andy C. Hung and Teresa H.-Y. Meng, "Error Resilient Pyramid Vector Quantization for Image Compression", IEEE Transactions on Image Processing, 1994, pp. 583-587.

Udar Mittal et al., "Encoder for Audio Signal Including Generic Audio and Speech Frames", U.S. Appl. No. 12/844,199, filed Jul. 27, 2010, 37 pages.

Daniele Cadel and Giorgio Parladori, "Pyramid Vector Coding for High Quality Audio Compression", IEEE Proceedings of Intl Conf. on Acoustics, Speech, and Signal Processing (ICASSP), Apr. 21-24, 1997, pp. 343-346, vol. 1.

Udar Mittal et al., "Decoder for Audio Signal Including Generic Audio and Speech Frames", U.S. Appl. No. 12/844,206, filed Sep. 9, 2010.

James P. Ashley, Edgardo M. Cruz-Zeno, Udar Mittal, and Weimin Peng, "Wideband Coding of Speech Using a Scalable Pulse Codebook", Proc. of the 2000 IEEE Workshop on Speech Coding, Sep. 2000.

Udar Mittaf, James P. Ashley, and Edgardo M. Cmz-Zeno, "Coding Unconstrained FCB Excitation Using Combinatorial and Huffman Codes", 2002, IEEE Workshop Proceedings., 2002.

Udar Mittal, James P. Ashley, and Edgardo M. Cruz-Zeno, "Low Complexity Factorial Pulse Coding of MDCT Coefficients Using Approximation of Combinatorial Functions", in Proc. IEEE ICASSP, Honolulu, HI, USA, Apr. 2007, vol. 1.

Tenkasi V. Ramabadran, "A Coding Scheme for rn-out-of-n Codes", IEEE Transactions on Communications, vol. 38, No. 8, August 1990.

"Low-complexity coding at 24 and 32 kbit/s for hands-free operation in systems with low frame loss", ITU-T G.722.1 Telecommunication Standardization Sector of ITU (May 2005).

"Frame error robust narrowband and wideband embedded variable bit-rate coding of speech and audio from 8-32 kbit/s", ITU-T G.718 Telecommunication Standardization Sector of ITU, (Jun. 2008).

Sean A. Ramprashad, "Sparse Bit-Allocations Based on Partial Ordering Schemes With Application to Speech and Audio Coding", IEEE Transactions on Audio, Speech, and Language Processing, vol. 15, No. 1, Jan. 2007.

Xiang Wei, Martyn J. Shaw and Martin R. Varley, "Optimum Bit Allocation and Decomposition for High Quality Audio Coding", 1997 IEEE International Conference on Acoustics, Speech, and Signal Processing (ICASSP'97)—vol. 1.

United States Patent and Trademark Office, "Non-Final Rejection" for U.S. Appl. No. 12/047,632, filed Oct. 18, 2011, 16 pages.

United States Patent and Trademark Office, "Non-Final Rejection" for U.S. Appl. No. 12/247,440, filed Oct. 20, 2011, 13 pages.

* cited by examiner

HYBRID ARITHMETIC-COMBINATORIAL ENCODER

FIELD OF THE INVENTION

The present invention relates generally to digital data such as audio data.

BACKGROUND

In the last twenty years microprocessor speed increased by several orders of magnitude and Digital Signal Processors (DSPs) became ubiquitous. It became feasible and attractive to transition from analog communication to digital communication. Digital communication offers the major advantage of being able to more efficiently utilize bandwidth and allows for error correcting techniques to be used. Thus by using digital technology one can send more information through a given allocated spectrum space and send the information more reliably. Digital communication can use radio links (wireless) or physical network media (e.g., fiber optics, copper networks).

Digital communication can be used for different types of communication such as audio, video or telemetry for example. A digital communication system includes a sending device and a receiving device. In a system capable of two-way communication each device has both sending and receiving circuits. In a digital sending or receiving device there are multiple staged processes through which data is passed between the stage at which it is input through an input (e.g., microphone, camera, sensor) and the stage at which it is used to modulate a carrier wave and transmitted. After (1) being input and then digitized, (2) some initial noise filtering may be applied, followed by (3) source encoding and (4) finally channel encoding. The present invention as will be described in the succeeding pages can be considered to fall in the source encoding stage.

One important type of data that is transmitted through digital communication systems is audio data. Audio data is a specific type of data within the broader category of time series data. In order for a communication system (such as a cellular telephone system) to be able to handle a large amount of communications within a limited allocated bandwidth multiple stages of compression an encoding are applied to digitized audio before it is transmitted through the communication system. For voice data, initial encoding can be based on a sophisticated yet somewhat simplified model of the human vocal apparatus, as in the case of Algebraic Code Excited Linear Predictive (ACELP) voice encoding. More generally, for different types of audio including but not limited to voice, other techniques such as the Modified Discrete Cosine Transform (MDCT) can be used. The techniques that are applied to audio in the initial encoding stages produce output in the form of vectors with integer valued (quantized) elements. For example one vector can be output for each successive short time period of 20 milliseconds which is called an audio frame. One way to limit the amount of information that is used to represent an audio frame, in order to work within bandwidth constraints, is to limit the total number of quanta (sum of the integer valued elements) in an audio frame. Once such a limit is imposed, it is possible efficiently represent (losslessly compress) the vectors using a technique called Factorial Pulse Coding (FPC). FPC is a form of combinatorial coding. An early version of FPC is described in the paper J. P. Ashley et al, "*Wideband Coding of Speech Using a Scalable Pulse Codebook*", 2000 IEEE Workshop on Speech Coding, Sep. 17, 2000. In FPC an ordering is defined for all the possible vectors that meet the imposed limit, and one or more indexes that specify a particular position in that ordering are used as a code to represent a particular vector corresponding to the particular position. An advantage of FPC is that encoding is highly efficient in terms of the number of bits needed to encode (represent) the vectors. A drawback is that computing the indexes for a given vector involves evaluation of combinatorial functions and is computationally intensive. U.S. Pat. No. 7,461,106 entitled "Apparatus and Method for Low Complexity Combinatorial Coding of Signals" provides advancements of FPC which use approximations of the combinatorial functions in order to reduce the computational cost of encoding and decoding.

An alternative to FPC is Arithmetic Coding (AC). AC is described in co-pending patent application Ser. No. 12/247,440 entitled "Arithmetic Encoding For CELP Encoders". AC is a form of range coding. In AC a binary sequence is mapped to a sub-region (probability region) of a code space (e.g., a subinterval of the interval from zero to one), and a number within the sub-region is used as a code to represent the binary sequence. For the initial bit the code space is divided into two sub-regions. One sub-region has a size proportional to the probability of a zero bit in the first bit position and the remaining sub-region has a size proportional to the probability of a one bit (one minus the probability of zero bit). One of the sub-regions is selected based on the actual value of the first bit. Successive bits, successively divide previously selected sub-regions in like manner until the complete binary sequence has been processed and a final sub-region has been identified. As taught in U.S. patent application Ser. No. 12/247,440 AC can also be used to encode integer valued (as opposed to binary) vectors. In order to do so, various information defining the integer valued vector is first transformed into a set of binary vectors and these are encoded using AC.

AC and FPC are two completely different types of encoders and there are certain advantages to each. For example, the inventors have made empirical observations that AC is more efficient when number of zero's and one's in binary vector to be encoded is more nearly equal, and otherwise FPC is more efficient. It would be desirable to be able to combine AC and FPC in order to obtain the advantages of both in one encoder and decoder system.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to digital encoding and decoding. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of encoding and decoding described herein. The non-processor circuits may include, but are not limited to, a radio receiver, a radio transmitter, signal drivers, clock circuits, power source circuits, and user input devices. As such, these functions may be interpreted as steps of a method to perform encoding and decoding. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Figure 1:
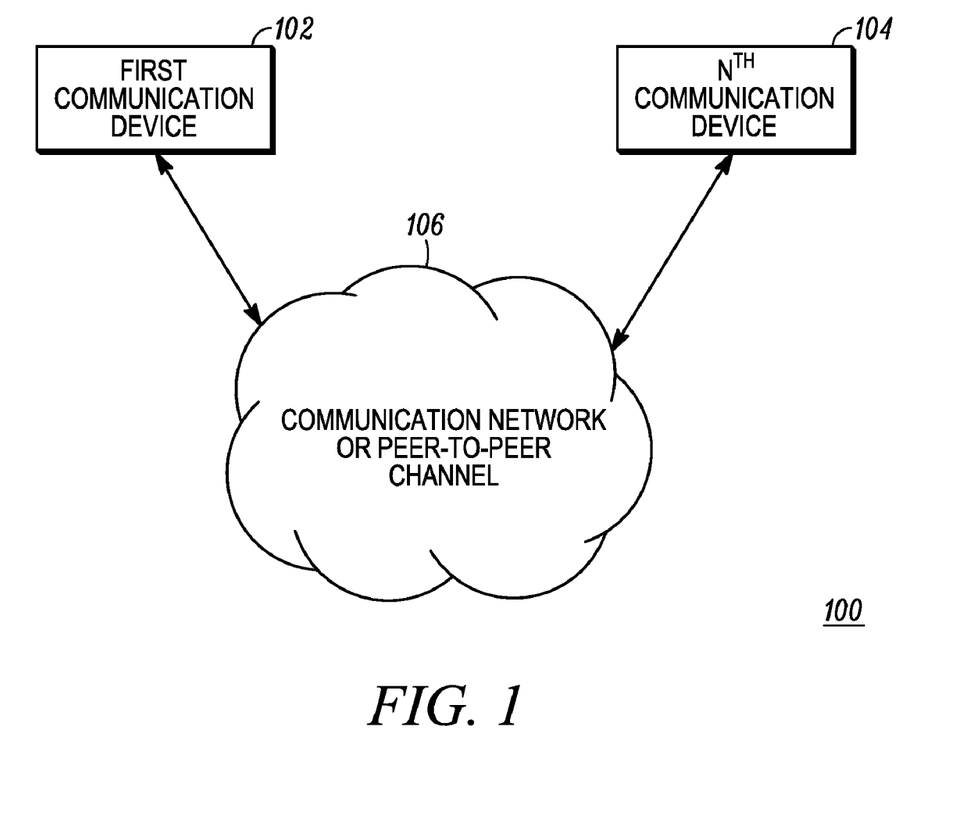
FIG. 1 is a block diagram of a communication system according to an embodiment of the invention.

FIG. 1 is a block diagram of a communication system 100 according to an embodiment of the invention. The communication system 100 includes a first communication device 102 and an $N^{TH}$ communication device 104 communicatively coupled through a communication network or peer-to-peer channel 106. At least one of the communication devices 102, 104 includes a transmitter and at least one of the communication devices 102, 104 comprises a receiver. Certain embodiments provide for two-way communication in which case both communication devices 102,104 include both a transmitter and a receiver.

Figure 2:
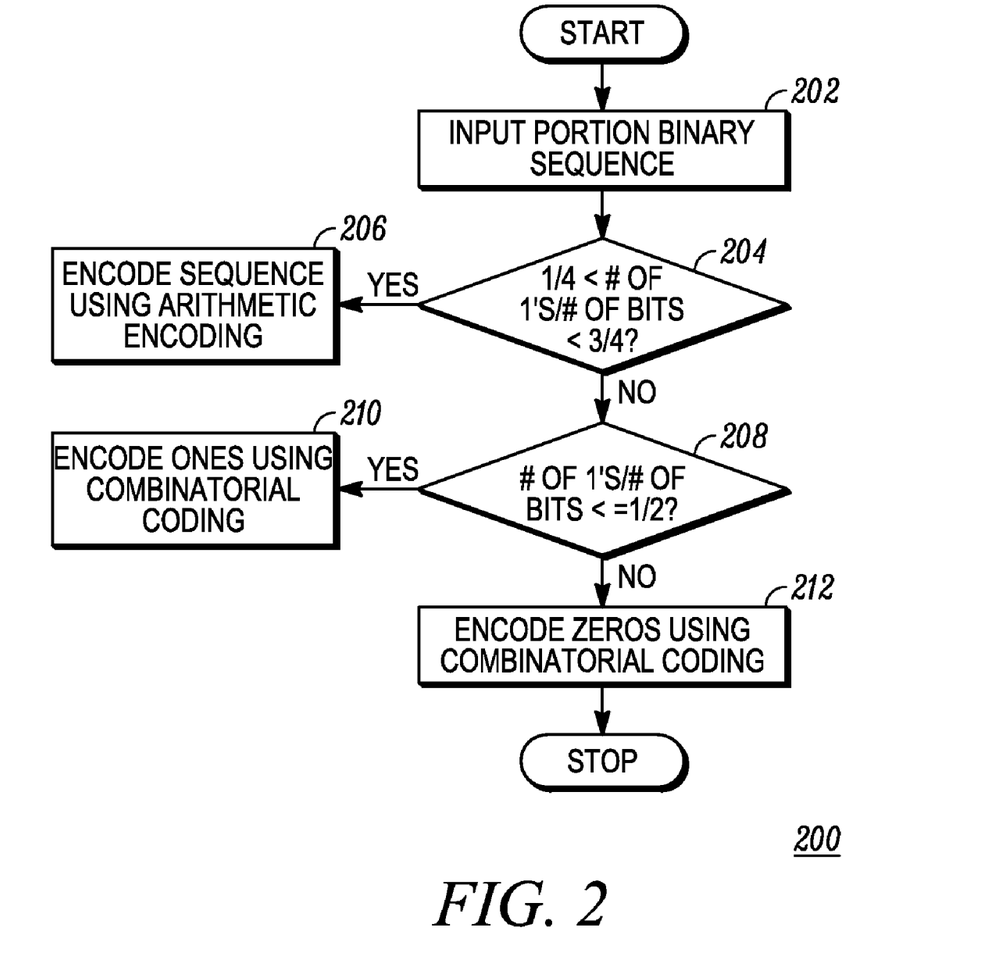
FIG. 2 is a flowchart of the operation of an encoder that uses either combinatorial coding or AC according to an embodiment of the invention.

FIG. 2 is a flowchart 200 of the operation of an encoder that uses either combinatorial coding or AC according to an embodiment of the invention. In block 202 a binary sequence is input. Block 204 test if a ratio of the number of ones in the binary sequence to the number of bits in the sequence is between ¼ and ¾. Alternatively the lower bound is another number between 0 and ½ and alternatively the upper bound is another number between ½ and 1. If the outcome of block 204 is positive then in block 206 the sequence is encoded using arithmetic encoding. Alternatively, another type of range coding may be used in lieu of arithmetic coding. If, on the other hand, the outcome of decision block 204 is negative, then the flowchart 200 branches to decision block 208 which tests if the ratio of the number of ones in the binary sequence to the number of bits in the binary sequence is less than or equal to ¼ (or an alternative bound). If the outcome of decision block 208 is positive then in block 210 the positions of the ones in the sequence are encoded using combinatorial coding. If, on the other hand the outcome of decision block 208 is negative, then in block 212 the positions of the zeros are encoded using combinatorial coding. Encoding either the ones or zeros by combinatorial coding based on which is less numerous reduce the computational complexity involved in encoding. Additionally, it has been found empirically that when the number of ones and zeros is more nearly equal (e.g., when block 204 is satisfied) then AC is more efficient than coding either the ones or zeros using combinatorial coding. A flag may be set indicate what type of encoding has been used.

Figure 3:
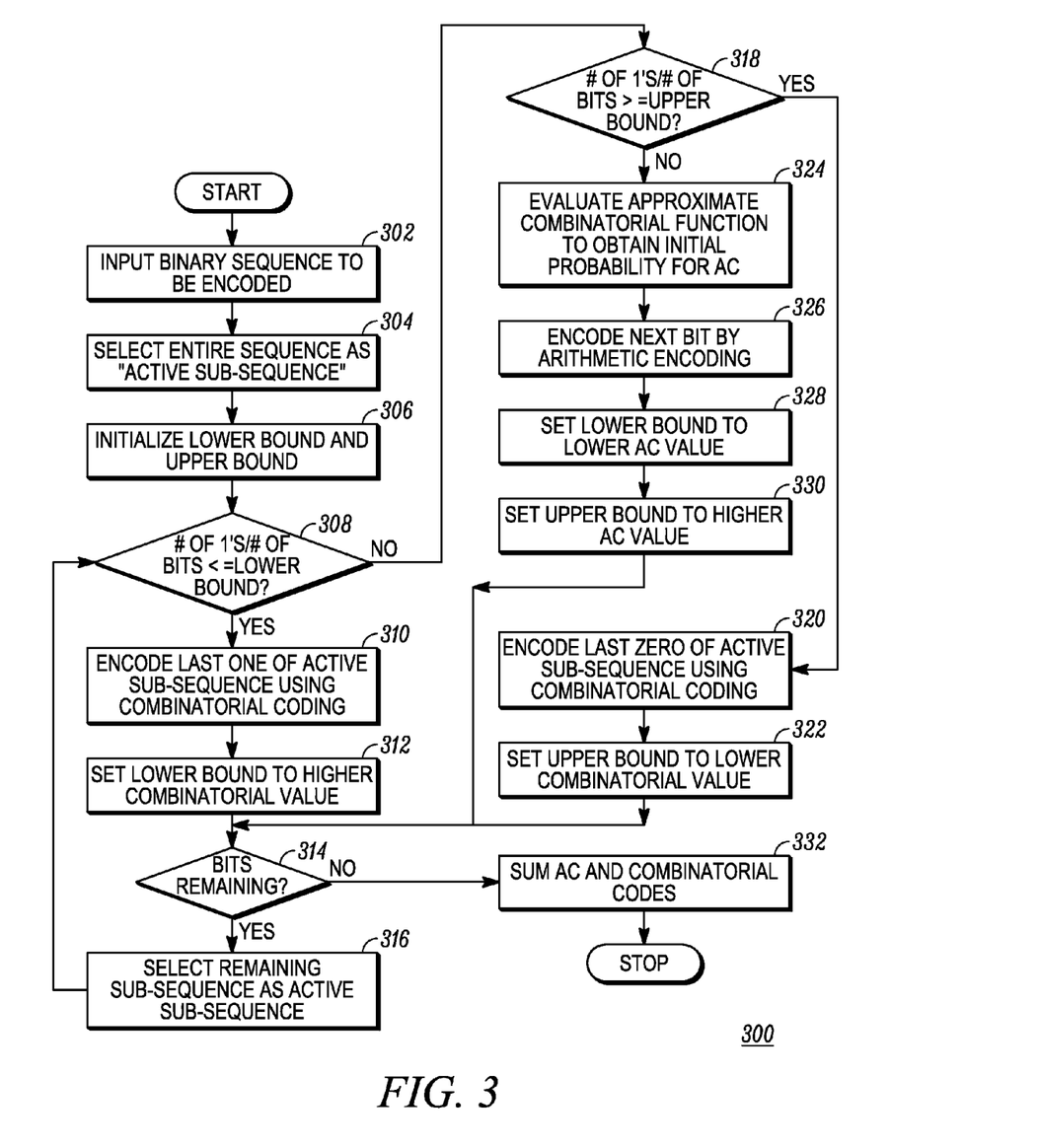
FIG. 3 is a flowchart of the operation of an encoder that dynamically switches between AC and combinatorial coding according to an embodiment of the invention.

FIG. 3 is a flowchart 300 of the operation of an encoder that dynamically switches between AC and combinatorial coding according to an embodiment of the invention. In block 302 a binary sequence is input. Initially, in block 304, the entire sequence is selected as the active sub-sequence. Subsequently, as the sequence is encoded, lesser parts of the sequence will be selected as the active sub-sequence. In block 306 an upper bound and a lower bound are initialized. The upper and lower bound are used in decision blocks to decide whether positions of zeros or ones are to be encoded using combinatorial coding or whether sub-sequences are to be encoded using AC instead. The upper and lower bound may for example be initialized ¾ and ¼ respectively or to alternative values in the ranges discussed above with reference to FIG. 2. Decision block 308 tests if the ratio of ones in the active sub-sequence to bits in the active sub-sequence is less than or equal to a current value (e.g., initially ¼) of the lower bound. Note as discussed further below the bounds are altered in the course of encoding in order to effect hysteresis in order to limit the incurred computational cost of switching back and forth between AC and combinatorial. If the outcome of block 308 is positive then in block 310 the position of the last one in the active sub-sequence is encoded using combinatorial coding. To encode the position of the last bit a combinatorial function is evaluated to produce an additive term of the code. In a basic form the code term is given by:

$$F(n, d) = \frac{n!}{d!(n-d)!} \quad \text{EQU. 1}$$

Where, n is the position index of the one (note that the indexing starts from zero at the first bit position); and
d is an integer that indicates which one, i.e., the first, second or third, etc is in question.

By way of example for an input bit sequence 0101100000, the position indices for the ones that are present are 1, 3, 4 so n would take on these values in the preceding formula if these bits are to be coded by combinatorial coding. Also since there are three ones so the variable 'd' would take on values of 1, 2 and 3. The one in position 4—the last one, has a value of d=3. The code term for the one in position 4 would then be found by evaluating F(4,3).

Equation 1 can be, in some cases, computationally intensive to evaluate. In lieu of EQU. 1 an approximation of F(n,d) such as taught in the aforementioned U.S. Pat. No. 7,461,106 can be used.

After block 310, in block 312 the lower bound is set to a higher value in order to reduce the probability of switching to AC. For example if the lower bound was initialized to ¼ it can be set to 0.33 in block 312. Alternative, values in the range 0 to ½ are also possible.

Next decision block 314 tests if there are more bits to be encoded. If there are further bits to be encoded, then in block 316 a remaining sub-sequence (not including bits already encoded) is selected as the active sub-sequence. After block 316 the flowchart 300 loops back to decision block 308.

When the outcome of decision block 308 is negative meaning that the ratio of the number of one bits to the number of bits is not less than the current value of the lower bound, then the flowchart branches to decision block 318. Decision block 318 tests if the ratio of the number of one bits to the number of bits is greater than or equal to the upper bound. If the outcome of decision block 318 is positive then in block 320 the last zero of the active sub-sequence is encoded using combinatorial coding. Next in block 322 the upper bound is set to a lower value in order to reduce the probability of switching to AC. For example if the upper bound was initialized to ¾ it can be set to 0.66 in block 322. After block 322 the flowchart 300 loops back to block 314 to test if there are more bits to be encoded, and proceeds as previously described. When the outcome of block 318 is negative meaning that the ratio of the remaining number of one bits to the remaining number of bits is between the lower bound and the upper bound, the flowchart branches to block 324. In block 324 an initial probability for use in AC coding one or more next bits in the remaining sub-sequence is computed by evaluating F(n,d) or an approximation thereof. For this purpose n is the remaining number of bits in the sub-sequence and m is the remaining number of ones in the sub-sequence. A zero is appended to the remaining sub-sequence and the initial probability is used as the probability for this initial zero. After adjusting the position in the AC code space based on the initial probability of the appended zero, in block 326 the next bit in the remaining sub-sequence is encoded by AC. Applying the initial probability in this manner makes the code bits generated using AC commensurate and compatible with the code bits generated using combinatorial coding. Alternatively, another type of range coding may be used in lieu of AC.

Next in block 328 the lower bound is set to a lower value and in block 330 the upper bound is set to a higher value, both changes serving to reduce the probability of switching back to combinatorial coding. By way of example if the lower bound was initialized to ¼ then in block 328 it can be set to 0.2 (or alternatively another value in the range 0 to 0.5). Additionally if the upper bound was initialized to ¾, then in block 330 it can be set to 0.8 (or alternatively another value in the range 0.5 to 1).

After block 330 the flowchart 300 loops back to block 314 to again test if there any bits remaining to be encoded. When the outcome of block 314 is negative, the flowchart branches to block 322 in which the code parts generated using combinatorial coding and AC are summed.

Figure 4:
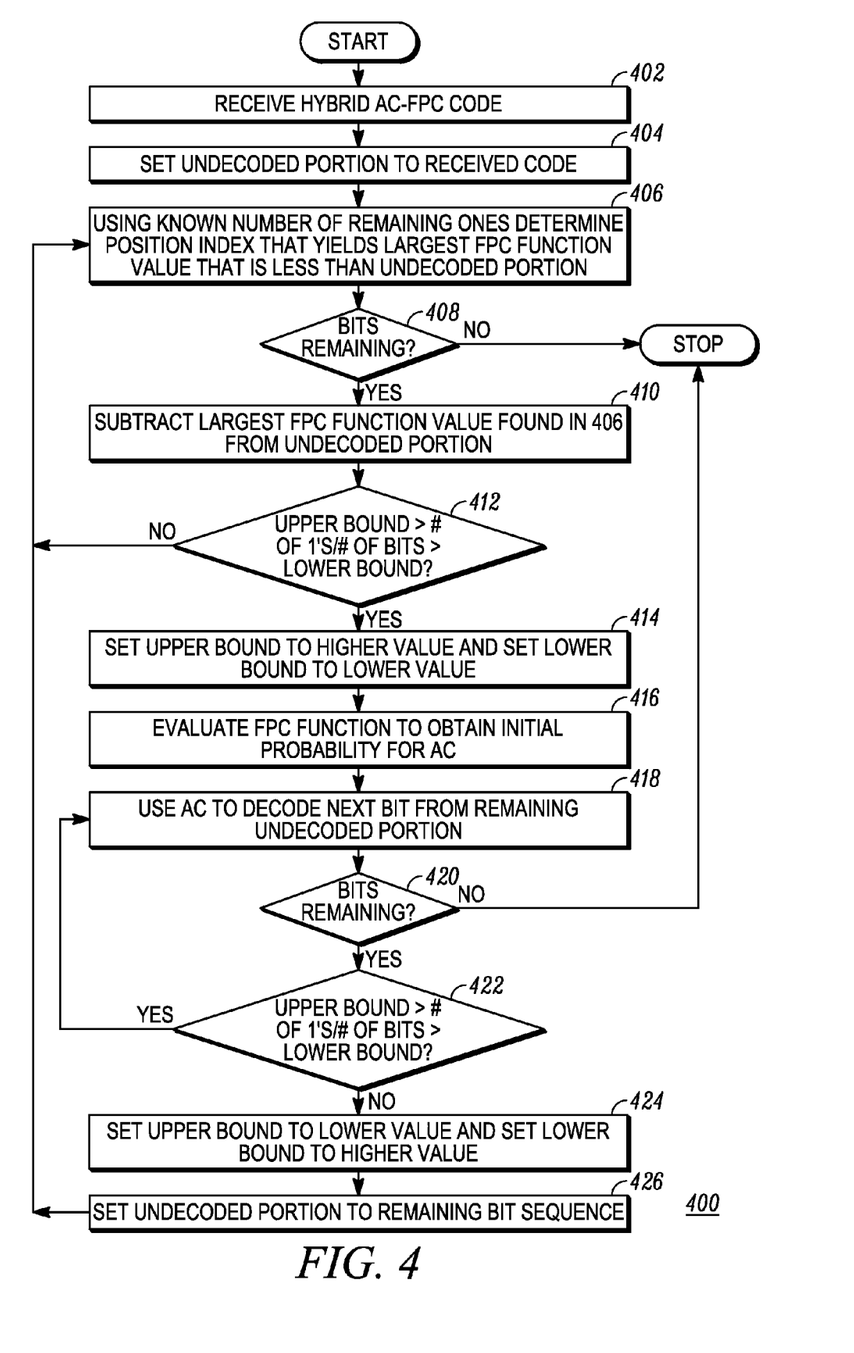
FIG. 4 is a flowchart of the operation of a decoder for decoding codes produced by the encoder described in FIG. 3.

FIG. 4 is a flowchart 400 of the operation of a decoder for decoding codes produced by the encoder described in FIG. 3. In block 402 a hybrid AC-FPC code is received. In block 404 an undecoded portion is set equal to the received code. In block 406 using a known number of remaining ones, the position index for the last position index that yields the large FPC function value that is less than the undecoded portion is determined. Note that the total number of ones can be a pre-programmed system parameter or can be communicated to the receiver separately. At any point in the process of decoding the decoder can decide whether to interpret the next code portion as encoding zeros by combinatorial coding ones by combinatorial coding or a bit sequence by AC. This is done by applying the same rules based on the ratio of remaining ones to the ratio of remaining bits that are used by the encoder. The FPC function used in block 406 can be that given by EQU. 1 or an approximation of F(n,d) such as taught in the aforementioned U.S. Pat. No. 7,461,106. In this context d is fixed based on the remaining number of ones and n is varied to find the largest FPC function value that is less than the undecoded portion of the code. Once this value is found the corresponding value of n gives the position of the next one or zero depending on whether ones or zeros have been encoded by combinatorial coding at this point in the sequence.

Next decision block 408 tests if there are any bits remaining to be decoded. If so then in block 410 the largest FPC function value that was found in block 406 is subtracted from the unencoded portion thereby generating a new "undecoded portion".

Next decision block 412 tests if the ratio of the number of ones remaining to be decoded to the number of bits remaining to be decoded is between an upper bound and a lower bound. The bounds used in the decoder are the same as used in the encoder and are altered in the decoder in the same fashion that they are altered in the encoder. If the outcome of decision block 412 is negative, meaning that decoding using combinatorial decoding is to continue, the flowchart loops back to block 406 and proceeds as previously described.

When, on the other hand the outcome of decision block 412 is positive, meaning that a transition to decoding by AC should be made, then the flowchart branches to block 414. In block 414 the upper bound is set to a higher value and the lower bound is set to a lower value. In block 416 the FPC function such as given by EQU. 1 or an approximation thereof such as taught in the aforementioned U.S. Pat. No. 7,461,106 is evaluated with n equal to the remaining number of bits and d equal to the remaining number of ones in order to obtain an initial probability for AC decoding. Next in block 418 AC is used to decode the next bit in the remaining undecoded portion. Next decision block 420 tests if there are any bits remaining to be decoded. If so then decision block 422 tests if the ratio of the remaining number of ones to the remaining number of bits is between the upper bound and the lower bound. If the outcome of block 422 is positive, the flowchart 400 loops back to block 418 to decode a next bit using AC. When the outcome of block 422 is negative the flowchart 400 branches to block 424 in which the upper bound is set to a lower value and the lower bound is set to a higher value. Next in block 426 the undecoded portion is set equal to the remaining bit sequence (remaining after decoding a portion by AC). After block 426 the flowchart loops back to block 406 and proceeds as described above. When the outcome of either block 408 or block 420 is negative, meaning that all of the bits have been decoded, the flowchart terminates.

According to another embodiment of the invention an arithmetic code word encoding positions of non-zero elements of an integer valued vector or an arithmetic code word representing the magnitudes of such non-zero elements or both such arithmetic codes are combined together using an FPC combined code formula along with codes representing other information e.g., a code representing the signs of the non-zero elements and a code representing the number of non-zero elements. An FPC combined code formula that may be used is:

$$C = C_v + (P(n,v)C_\mu + C_\pi)2^v + C_\sigma \qquad \text{EQU. 2}$$

In this FPC combined code formula:
v is the number of non-zero elements;
$C\pi$ is the arithmetic code word representing the locations of the non-zero elements;
$C\mu$ is the arithmetic code word representing the magnitudes of the non-zero elements;
$C\sigma$ is an FPC code word representing the signs of the non-zero elements;
Cv is a code word representing a number of non-zero pulses and is given by:

$$C_v = \sum_{k=v+1}^{min(m,n)} P(n,k)M(m-1,k-1)2^k \qquad \text{EQU. 3}$$

where,
P(n,k) is an initial probability used to generate an arithmetic code word representing a binary sequence of n bits and k one-valued bits;
M(m−1,k−1) is an initial probability used to generate an arithmetic code word representing a binary sequence that encodes the magnitudes of k pulses having a summed magnitude quanta equal to m. Such a binary sequence may be obtained from the original integer valued vector to be encoded by replacing each magnitude integer by a sequence of zeros numbering one less than the magnitude integer followed by a one. The following are examples of magnitude vectors at the left and corresponding binary vectors at the right that result from the foregoing conversion process:

(4 1 1)  (0 0 0 1 1)

(1 4 1)  (1 0 0 0 1)

(1 1 4)  (1 1 0 0 0)

(3 2 1)  (0 0 1 0 1)

Note that the formula for Cv is adapted from FPC but uses arithmetic code initial probability factors in the summand. Note also that in obtaining $C\pi$ and $C\mu$ an initial probability obtained by applying equation 1 or a lower computational cost approximation thereof is used. Using the initial probability makes the AC codes compatible with the FPC formula given by EQU. 2. The initial probability reduces an initial position in the AC code space.

According to an alternative embodiment $C\pi$ and/or $C\mu$ are selectively determined by AC or combinatorial coding depending on how the ratio of the number one-valued bits to the total number of bits compares to certain bounds, in a manner such as described above with reference to FIGS. 2-4. In the case of $C\pi$ such a ratio is the ratio of non-zero pulse to total possible pulse positions. In the case of $C\mu$ this is the ratio of one-bits to total bits in the binary sequence representing the magnitudes which are described above.

The initial probability P(n,v) should satisfy the following relation:

$$P(n, v) \approx \frac{F(n, v)}{2^{\lceil \log_2(F(n,v)) \rceil}} > \frac{1}{2}$$

Now the smaller the value of P(n,v) the more is the advantage of using the coding technique described by EQU. 2 and EQU. 3. However, assigning lower value of P(n,v) will result in the code sequence having significantly higher information content than a sequence that does not use the initial probability and hence may require an extra bit. Basically the optimum valued of P(n,v) will be smallest value such that the number of bits required to code the modified sequence using arithmetic coding is the same as that of the length of codeword used for coding without using the initial probability. If this is so the coding technique described by EQU. 2 and EQU. 3 has the advantages that an extra bit is not needed, memory requirements are reduced compared to prior art FPC methods because AC is used for coding positions and magnitudes. Only a small amount of memory may be needed for storing values of P(n,v). In applicants co-pending patent application Ser. No. 12/247,440 an upper bound on the extra or overhead bits used for coding using AC with finite fixed precision length w was obtained. The upper bound is given by:

$$\Omega(n,v,w) = \log_2(1/1-(n/v)2^{-(w+1)}) + \log_2(1/1-(n-1/v-1) \\ 2^{-(w+1)}) + \ldots + \log_2(1/1-(n-v+1/1)2^{-(w+1)}) + \\ \log_2(1/1-(n/n-v)2^{-(w+1)}) + \log_2(1/1-(n-1/n-v-1) \\ 2^{-(w+1)}) + \ldots + \log_2(v+1/1)2^{-(w+1)}) \qquad \text{EQU. 4}$$

The initial probability is now obtained as:

$$P(n, v, w) = \frac{2^{\log_2\{F(n,v) + \Omega(n,v,w)\}}}{2^{\lceil \log_2\{F(n,v) + \Omega(n,v,w)\} \rceil}} > \frac{1}{2}. \qquad \text{EQU. 5}$$

A stronger bound than that described by EQU. 4 may be obtained using a trellis method which is described as follows. In arithmetic coding a probability region [0, 1] is divided into smaller probability regions. The current probability region of length y is further divided in probability regions of length less than y. The number of bits needed to code the region is equal to the logarithm of inverse of the length of the final probability region. Consider coding of positions of v ones in a n length binary sequence, and define the minimum length of the probability region after coding of $n_1$ binary positions of which $v_1$, are ones as $y_{min}(n, v, n_1, v_1)$. Also define such a sequence as $\zeta(n_1, v_1)$. Further define $y(\zeta(n_1, v_1))$ as the length of the probability region of $\zeta(n_1, v_1)$. Note that if we have infinite precision then the length of probability region for each of these sequences will be same. However, the finite fixed precision makes the length of the probability region dependent on the order of ones and zeros in the sequence. A binary sequence $\zeta(n_1, v_1)$ is obtained from $\zeta(n_1-1, v_1-1)$ by concatenation of a one or from $\zeta(n_1-1, v_1)$ by concatenation of a 1. So the probability regions $y(\zeta(n_1, v_1))$ is either $$y(\zeta(n_1, v_1)) = \text{round}\left(y(\zeta(n_1-1, v_1-1)) \cdot \frac{v-v_1+1}{n-n_1+1}\right) \quad \text{EQU. 6}$$

Or $$y(\zeta(n_1, v_1)) = \text{round}\left(y(\zeta(n_1-1, v_1)) \cdot \frac{n-n_1+1-v+v_1}{n-n_1+1}\right). \quad \text{EQU. 7}$$

Define:

$$y_{min}(\zeta(n_1, v_1), 1) = \min\left[\text{round}\left(y(\zeta(n_1-1, v_1-1)) \cdot \frac{v-v_1+1}{n-n_1+1}\right)\right] \quad \text{EQU. 8}$$
$$= \text{round}\left(y_{min}(n, v, n_1-1, v_1-1) \cdot \frac{v-v_1+1}{n-n_1+1}\right),$$

$$y_{min}(\zeta(n_1, v_1), 0) = \min\left[\text{round}\left(y(\zeta(n_1-1, v_1)) \cdot \frac{n-n_1+1-v+v_1}{n-n_1+1}\right)\right] \quad \text{EQU. 9}$$
$$= \text{round}\left(y_{min}(n, v, n_1-1, v_1) \cdot \frac{n-n_1+1-v+v_1}{n-n_1+1}\right)$$

$$y_{min}(n, v, n_1, v_1) = \min(y_{min}(\zeta(n_1, v_1), 0), y_{min}(\zeta(n_1, v_1), 1)) \quad \text{EQU. 10}$$

Thus $y_{min}(n, v, n_1, v_1)$ is a function of $y_{min}(n, v, n_1-1, v_1-1)$ and $y_{min}(n, v, n_1-1, v_1)$. Hence, it can be calculated using a trellis structure. Note that the length of the final probability region is given by $y_{min}(n, v, n, v)$. The bound can now be calculated from the length of the final probability region. The bound calculated using the trellis method is significantly lower than the bound calculated using EQU. 4. For the initial probability assignment in EQU. 5, the bound derived using the trellis method will result in lower values of the initial probability assignment. Table below compares the bound calculated using the trellis method and using equation EQU. 4.

| Length of Binary Sequence (n) | Number of Ones (v) | Length of fixed Precision (w) | Bound From (9) | Bound Using Trellis |
|---|---|---|---|---|
| 280 | 22 | 14 | 0.109368 | 0.021418 |
| 280 | 50 | 10 | 1.931138 | 0.377091 |
| 107 | 39 | 14 | 0.038382 | 0.006988 |

Whereas EQU. 1 is used in a basic form of FPC, alternatively FPC is based on an approximation of the combinatorial formula given by EQU. 1 that are less computationally intensive to evaluate. One approximation that is used according to alternative embodiments of the invention is:

$$F'(n, k) = R\left(\sum_{i=n-k+1}^{n} P'(i) - Q'(k)\right) \quad \text{EQU. 11}$$

where:

$$Q'(k) = \begin{cases} 0, & k=1 \\ \sum_{j=2}^{k} 2^{-l_Q}\lfloor 2^{l_Q}\log_2(j)-1\rfloor & k>1, \end{cases} \quad \text{EQU. 12}$$

and R'(t) is an approximation of the function $R'(t)\approx 2^t$, given as:

$$R'(t) = \lfloor 2^{t_i-l_R}\lfloor 2^{l_R}T_f\rfloor\rfloor, \quad \text{EQU. 13}$$

where $t=t_i+t_f$ is broken down into integer and fractional components of t, and $T_f=2^{t_f}$ is a low resolution Taylor series expansion of the fractional component of t. Based on the above pre-defined functions Q'(k) and R'(t), P'(i) are obtained so that the unique decodability inequality:

$$F'(n,k) \geq F'(n-1,k) + F'(n-1,k-1) \text{ holds.} \quad \text{EQU. 14}$$

In the case of dynamic switching between AC and FP, the approximate combinatorial function is generated using the same approach. However, in this case the P'(i) are obtained so that besides unique decodability inequality following inequalities are also satisfied.

$$\text{round}\left(\frac{(n-k)F'(n, k)}{n}\right) \geq F'(n-1, k) \quad \text{EQU. 15}$$

$$\text{round}\left(\frac{k \cdot F'(n, k)}{n}\right) \geq F'(n-1, k-1) \quad \text{EQU. 16}$$

$$\frac{F'(n, k)}{2^{\lfloor \log_2(F'(n,k))\rfloor}} \geq P(n, k, w) \quad \text{EQU. 17}$$

Figure 5:
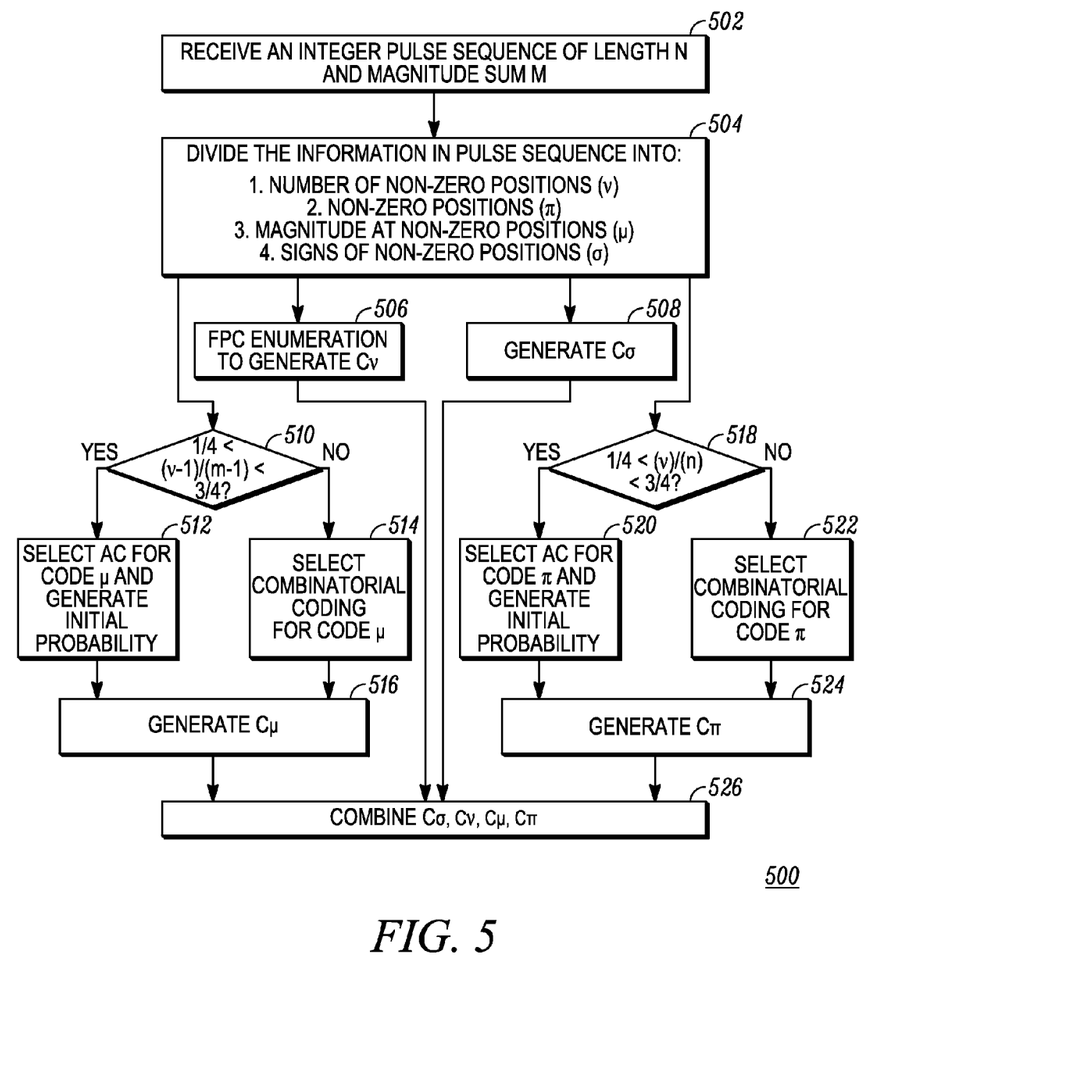
FIG. 5 is a flowchart of an encoder that selectively uses AC and combinatorial coding to generate individual code words and combines the individual code words using an FPC combined code formula.

FIG. 5 is a flowchart of an encoder that selectively uses AC and combinatorial functions from FPC to generate individual code words and combines the individual code words using an FPC combined code formula. In block 502 an integer valued vector representing a sequence of pulses is received. The length of the vector is equal to n and the sum of magnitudes of the integer valued elements is m. m can be said to be the sum of magnitude quanta of the pulses represented by the vector.

In block 504 the information included in the integer valued vector is divided into four parts, namely the number of non-zero positions denoted v, the actual locations of the non-zero positions denoted π, the magnitude of the non-zero elements denoted μ, and the signs of the non-zero elements denoted σ. This is a division of the information that is used in FPC.

In block 506 an FPC enumeration formula (EQU. 3) is used to generate a code word for the number of non-zero positions. This code word is denoted $C_v$. In parallel, in block 508 an FPC code word for the signs of the non-zero elements is generated. This code word is denoted $C_\sigma$ and is given by the following formula:

$$C_\sigma = \sum_{i=1}^{v} 2^{i-1}\sigma_i \quad \text{EQU. 18}$$

Where $\sigma_i$ is a binary code for the sign of the $i^{TH}$ non-zero element. $\sigma_i$ is equal to one if the sign is positive and $\sigma_i$ is equal to zero if the sign is negative.

Decision block 510 test if a ratio (v−1)/(m−1) is between ¼ and ¾. As discussed above alternative bounds may be used in lieu of ¼ and ¾. For the magnitude information this ratio is analogous to the ratio of one-valued bits to the total number of bits. If the outcome of decision block 510 is positive then in block 512 AC is selected to code the magnitudes. If on the other hand the outcome of block 510 is negative then in block 514 combinatorial coding is selected to code the magnitudes. After a selection of AC or combinatorial is made in blocks 512 or 514, in block 516 the code word for the magnitudes, denoted Cµ, is generated. In the case of AC the magnitude information is first transformed into a binary vector as discussed above. If AC is the selected method than an initial probability is computed using an FPC combinatorial formula e.g., EQU. 1 or a low cost approximation thereof, e.g., EQU. 11. If combinatorial coding is the selected method than an combinatorial code for the magnitudes can be computed using the following formula.

$$C_\mu = \Sum_{k=1}^{v} F(\Sum_{j=1}^{k} m_j, k)$$ EQU. 19 where, $m_j$ is the magnitude of the $j^{TH}$ non-zero element and the function F is an FPC combinatorial formula, e.g., EQU. 1 or a low cost approximation thereof, e.g., EQU. 11.

Separately, decision block 518 tests if the ratio of the number of non-zero elements v to the number of elements n in the input vector is between ¼ and ¾. Alternatively other bounds may be used. If the outcome of decision block 518 is positive then in block 520 AC is selected to encode the information as to the positions of the non-zero elements and an initial probability based on FPC (e.g., EQU. 1 or EQU. 11) is generated. Alternatively, another type of range coding may be used in lieu of arithmetic coding to code magnitudes and positions. If, on the other hand, the outcome of decision block 518 is negative then block 522 combinatorial coding is selected to encode the information as to the positions of the non-zero elements. After either block 520 or 522, in block 524 the code for representing the position information, denoted Cπ is generated.

In block 526 the code components $C_v$ $C_\sigma$ $C_\mu$ and $C_\pi$ are combined e.g., by EQU. 2.

Figure 6:
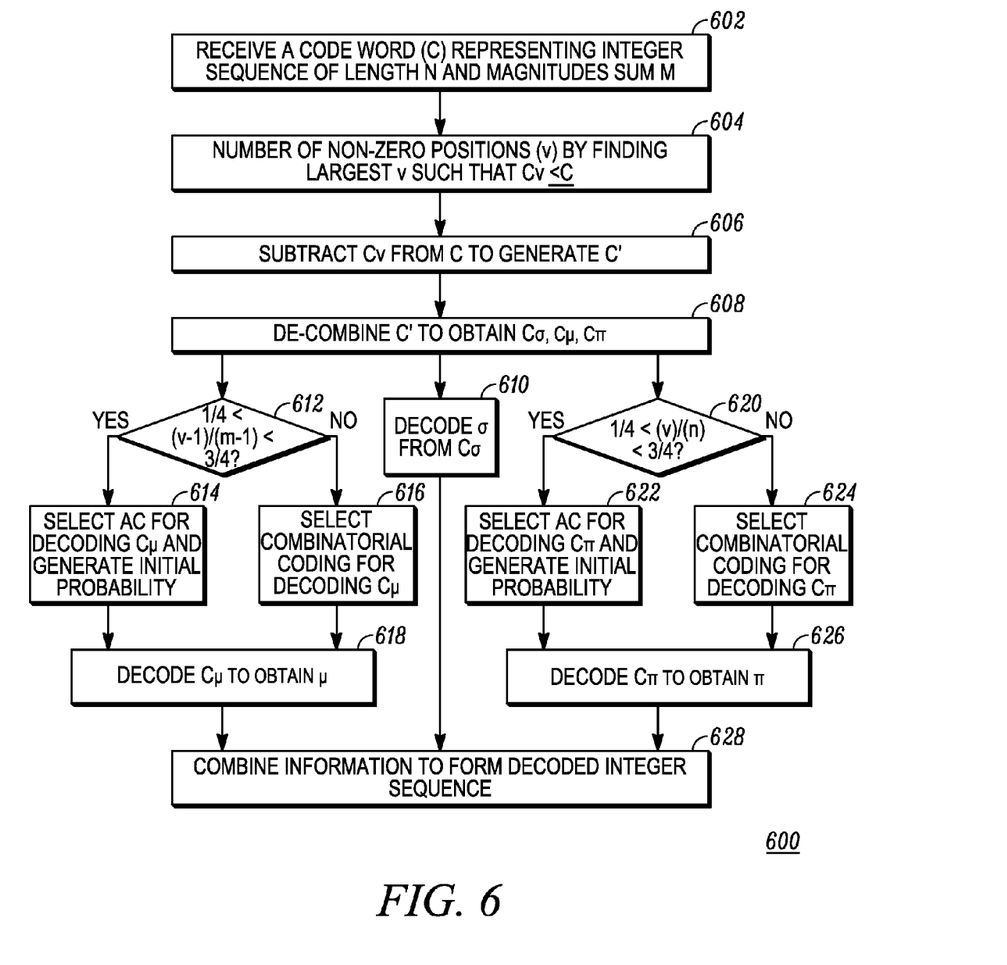
FIG. 6 is a flowchart of decoder for decoding the codes generated by the encoder shown in FIG. 5.

FIG. 6 is a flowchart 600 of decoder for decoding the codes generated by the encoder shown in FIG. 5. In block 602 a codeword C that represents an integer valued vector (sequence) of length n with a magnitude sum m is received. In block 604 the number of non-zero positions v is found by finding the largest codeword $C_v$ that is less than C. Note that $C_v$ is a function of v and n given by an FPC combinatorial function or enumeration method (e.g., EQU. 3).

In block 606 the value of $C_v$ found in the preceding step is subtracted from the received codeword C obtaining a remaining codeword C'. In block 608 C' is decombined to obtain $C_\sigma$ $C_\mu$ and $C_\pi$. One way to decombine is to extract the last v bits C' and set these equal to $C_\sigma$. The remaining sequence of bits is denoted C". $C_\mu$ is then set equal to C" divided by P(n,k,w), and $C_\pi$ is set equal to C" mod P(n,k,w). This assumes that C" was equal to P(n,k,w) $C_\mu$+$C_\pi$.

After block 606, blocks 610, 612 and 620 proceed in parallel. In block the signs of the non-zero elements of the vector denoted σ are decoded from $C_\sigma$ according to equation 18.

Block 612 is a decision block that test if the ratio (v−1)/(m−1) is between ¼ and ¾. If so then in block 614 AC is selected for decoding $C_\mu$ and an initial probability for decoding $C_\mu$ to be used is generated by applying an FPC combinatorial function (e.g., EQU. 1 or EQU. 11). If the outcome of decision block 612 is negative then in block 616 combinatorial coding is selected for decoding $C_\mu$. After either block 614 or block 616 in block 618 $C_\mu$ is decoded using the selected method.

Block 620 is a decision block that tests if the ratio of the number of non-zero elements v to the number of elements n in the input vector is between ¼ and ¾. If the outcome of decision block 622 is positive then in block 622 AC is selected for decoding $C_\pi$, and an initial probability for decoding $C_\pi$ is generated using an FPC combinatorial function (e.g., EQU. 1 or EQU. 11). If the outcome of decision block 620 is negative then in block 624 combinatorial coding is selected for decoding $C_\pi$. After either block 622 or 624 in block 626 $C_\pi$ is decoded using the selected method. Thereafter, in block 628 the information as to the positions of the non-zero elements from $C_\pi$, the information as to the magnitudes of the non-zero elements from $C_\mu$ and information as to the signs of the non-zero elements from $C_\sigma$ is combined to re-construct the encoded integer valued vector.

Figure 7:
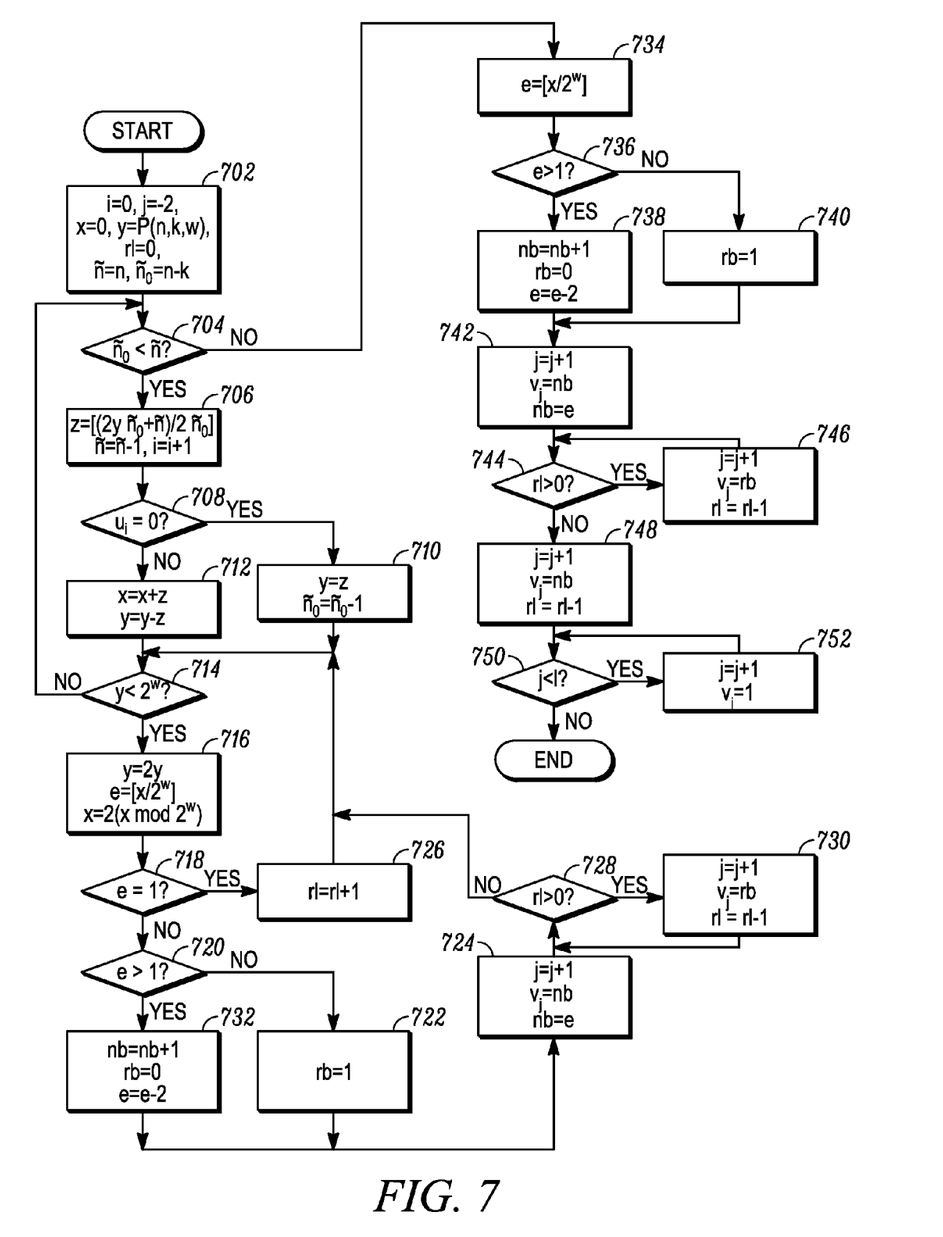
FIG. 7 is a flowchart of an AC encoder that uses and initial probability in order to make the AC codes generated thereby suitable for combination with FPC codes.
Figure 8:
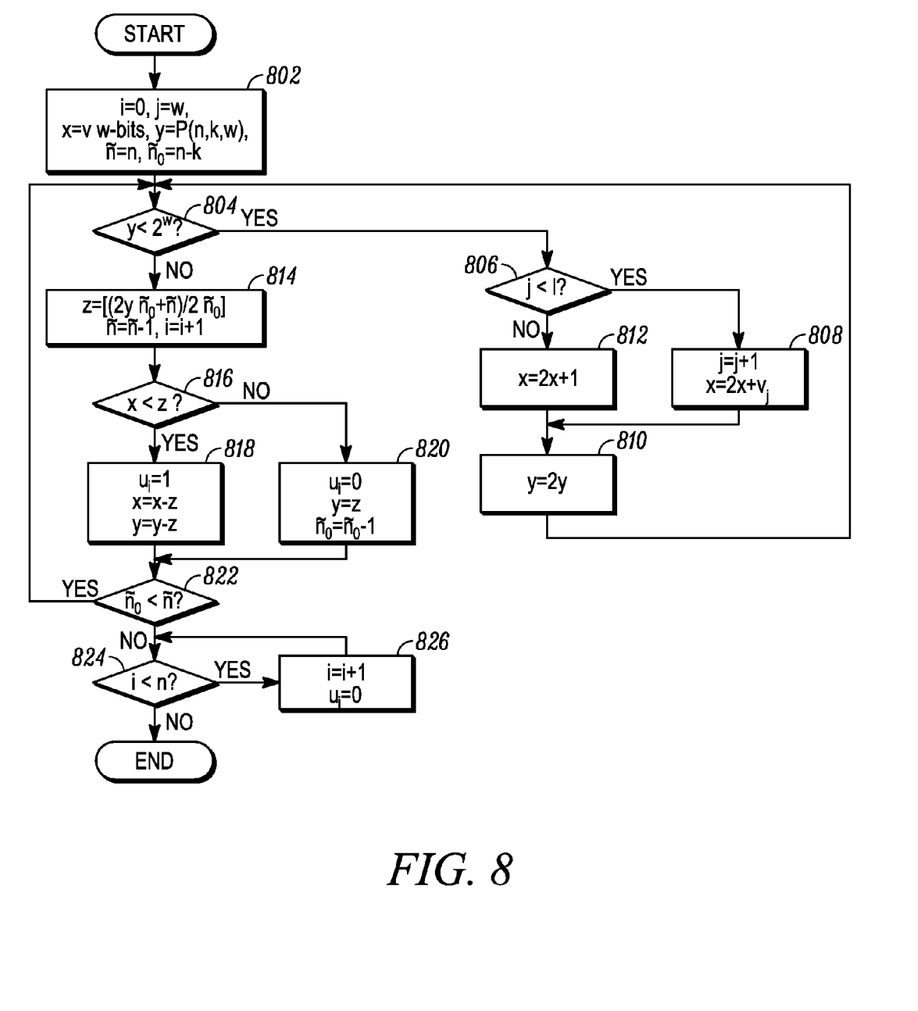
FIG. 8 is a flowchart of an AC decoder for use with the AC encoder shown in FIG. 7.

FIG. 7 is a flowchart 700 of an arithmetic encoder according to an embodiment of the invention, and FIG. 8 is a flowchart 800 of an arithmetic decoder according to an embodiment of the invention. The flowcharts in FIG. 7 and FIG. 8 can be used respectively to encode and decode the positions and magnitudes of the pulses. The number of pulses and the signs of the pulses can also be encoded and decoded using appropriately configured arithmetic encoders and arithmetic decoders respectively. A single code word can be computed to represent collectively the number of pulses, the positions, the magnitudes, and the signs of the pulses. Alternately, individual code words can be computed to represent separately the number of pulses, the positions, the magnitudes, and the signs of the pulses, and optionally these individual code words can be concatenated to form a single code word. Between the two extremes above any other combination is also possible, for example, a single code word can be computed to represent the positions and magnitudes together, and two individual code words can be computed to represent the number of pulses and the signs separately. The variables used in FIG. 7 and FIG. 8 are defined in Table I below:

TABLE I

| Symbol | Meaning | Upper bound |
|---|---|---|
| $u_i$ | $i^{th}$ information bit | 1 |
| i | index for the information word α: $u_1, u_2, \ldots, u_n$ | n |
| $v_j$ | $j^{th}$ code bit | 1 |
| j | index for the codeword β: $v_1, v_2, \ldots, v_l$ | l |
| w | precision parameter | design value |
| x | (w + 2) least significant bits of the start of the interval corresponding to α and its prefixes | $2^{w+2} - 1$ |
| y | (w + 1) least significant bits of the width of the interval corresponding to α and its prefixes | $2^{w+1} - 1$ |
| n | number of information bits | design value |
| l | number of code bits | design value |
| k | number of 1's in α, i.e., the weight of α | design value |
| ñ | number of bits yet to be scanned in α | n |
| ñ₀ | number of 0's yet to be scanned in α | n − k |
| z | value of $\lfloor (2y\tilde{n}_0 + \tilde{n})/2\tilde{n} \rfloor$ | y |
| e | ejected value from x, a code bit plus a possible carry | 3 |
| nb | next bit to be stored away (or transmitted) | 1 |
| rb | Run bit, 0 if there is a carry and 1 if there is none | 1 |
| rl | Run length | l |

Referring to FIG. 7 the encoding algorithm will be described. In block 702 the variables i, j, x, y, rl, ñ, and ñ₀ are initialized. The value P(n,k,w) to which y is initialized is the above mentioned initial probability (initial code space position) and in one form is given by equation 5 above.

After block 702, decision block 704 tests if there are any remaining ones in the sequence α being encoded. If so the flowchart branches to block 706 in which the quantity z is computed, the number of information bits yet to be coded ñ is decremented, and the index i is incremented. Initially the outcome of decision block 704 is positive. The quantity z is related to the size of the portion of the code space that is associated with a zero value for a current bit position in the sequence being encoded and is a fraction of the portion of the code space associated with a previous bit. In particular the fraction associated with a zero bit is set to the number of zero bits remaining divided by the total number of bits remaining. This is accomplished in the computation of z in block 706. Given the region corresponding to a previous bit represented by the integer y, the region corresponding to a zero bit at the current position is obtained by multiplying y with the probability of a zero bit and rounding the result to the nearest integer. As shown, a bias of ½ and the floor function are used for rounding to the nearest integer. Alternatively, fixed probabilities can be used. For example if the pulse sign information is to be encoded separately, and there is an equal probability of pulses being positive and negative, the computation of z can be based on fixed probabilities of zero and one bits equal to ½.

Next the flowchart 700 reaches decision block 708 which tests if the current bit in the sequence being encoded, identified by index i, is a zero or one. If the current bit is a zero then in block 710 the value y is set equal to z and $ñ_0$ (the number of zeros yet to be encountered) is decremented. The value of x is unchanged. On the other hand if the current bit is a one then in block 712 y is set equal to a previous value of y minus z and x is set equal to a previous value of x plus z. The new value of y is a proportion of the previous value of y with the proportion given by the probability of the current bit value (zero or one). x and y are related respectively to the starting point and the width of the area within the code space that corresponds to the bit sequence encoded so far.

After either block 710 or 712 decision block 714 is reached. Decision block 714 tests if the value of y is less than $2^w$. (Note that blocks 706, 710 and 712 will reduce the value of y.) If so then in block 716 the value of y is scaled up by a factor of 2 (e.g., by a left bit shift), the value of e is computed, and the value of x is reset to $2(x \mod 2^w)$. Using the mod function essentially isolates a portion of x that is relevant to remaining, less significant code bits. Because both y and x are scaled up in block 716 in a process referred to as renormalization, even as the encoding continues and more and more information bits are being encoded, the full value of $2^w$ is still used as the basis of comparison of x in the floor function to determine the value of the code bits. Similarly, the full value of $2^w$ is still used as the basis of comparison of y in the decision block 714.

After block 716, decision block 718 tests if the variable e is equal to 1. If the outcome of decision block 718 is negative, then the flowchart 700 branches to decision block 720 which tests if the variable e is greater than 1 (e.g., if there is an overflow condition). If not, meaning that the value of e is zero, the flowchart 700 branches to block 722 wherein the value of the run bit variable rb is set equal to 1.

Next the flowchart 700 reaches block 724 in which the code bit index j is incremented, the code bit $v_j$ is set equal to value of nb, and then nb is set equal to e. Note that for the first two executions of block 724, j is set to values less than one, so the values of $v_j$ that are set will not be utilized as part of the output code.

When the outcome of decision block 718 is positive the flowchart 700 will branch through block 726 in which the run length variable rl is incremented and then return to decision block 714. Decision block 728 tests if the run length variable rl is greater than zero—the initial value. If so then in block 730 the index j is incremented, code bit $v_j$ is set to the run bit variable rb, and the run length rl is decremented, before returning to decision block 728. When it is determined in decision block 728 that the run length variable rl is zero the flowchart 700 returns to block 714.

If the outcome of decision block 720 is positive, i.e., an overflow condition has been detected, then the flowchart 700 branches to block 732 in which the nb variable is incremented, the rb variable is zeroed, and the e is decremented by 2, after which the flowchart 700 proceeds with block 724.

If it is determined in decision block 704 that only zeros remain in the sequence being encoded, then the flowchart 700 branches to block 734 in which the value of the variable e is computed as the floor function of x divided by $2^w$. Next decision block 736 tests if e is greater than 1. If so then in block 738 the next bit variable nb is incremented, the run bit variable rb is set equal to 0, and the variable e is decremented by 2. If the outcome of decision block 736 is negative, then in block 740 the run bit variable rb is set equal to 1. After either block 738 or 740, in block 742, the index j is incremented, the code bit $v_j$ is set equal to the next bit variable nb, and the next bit variable nb is set equal to e.

Next decision block 744 tests if the run length variable rl is greater than zero. If so then in block 746 the index j is incremented, the code bit $v_j$ is set equal to the run bit variable rb, and the run length variable rl is decremented, after which the flowchart 700 returns to block 744.

After block 744 in block 748 the index j is incremented, and the code bit $v_j$ is set equal to the next bit variable nb. Next decision block 750 tests if the index j is less than the code length l. If so then block 752 sets remaining code bits to 1. When j reaches l the encoding terminates.

Referring to FIG. 8 a flowchart 800 of an arithmetic decoding method corresponding to the encoding method shown in FIG. 7 will be described. In block 802 the variables i, j, x, y, ñ, and $ñ_0$ are initialized. Y is initialized to an initial code space position P(n,k,w). Block 804 tests if y is less than $2^w$. When, as is the case initially, this is true, the flowchart 800 branches to decision block 806 which tests if the index j is less than l. When, as is the case initially, this is true, the flowchart 800 branches to block 808 in which j is incremented, and the variable x is reset to $2x+v_j$. Basically, successive executions of block 808 build up the value of x based on the values of the code bits, taking into account the position (significance) of the bits. After block 808 in block 810 the value of y is similarly increased by multiplying by two. After block 810 the flowchart 800 returns to decision block 804. When the end of the codeword is reached, i.e., after j reaches l, the outcome of decision block 806 will be negative, and in this case, in block 812 x is set to 2x+1. This is equivalent to reading in a code bit with a value of 1.

After block 812 block 810 is executed. When it is determined in decision block 804 that y is not less than $2^w$, the flowchart 800 branches to block 814 which computes the value of z as shown, decrements the number of information bits yet to be decoded ñ, and increments the index i which points to bits of the decoded sequence. Next decision block 816 tests if x is less than z. If not then in block 818 an $i^{th}$ decoded bit $u_i$ is set equal to one, x and y are decremented by z to account for the parts of x and y represented by the $i^{th}$ bit just decoded. If decision block 816 determines that x is less than z then in block 820 the $i^{th}$ decoded bit $u_i$ is set equal to zero, y is set equal to z, and the number of zeros yet to be encountered $ñ_0$ is decremented to account for the zero bit $u_i$ just decoded.

After either block 818 or 820 decision block 822 tests if the number of zeros remaining is less than the total number of bits remaining. If the outcome of block 822 is affirmative, the flowchart 800 loops back to decision block 804. If the outcome of block 822 is negative, the flowchart branches to decision block 824 which tests if i is less than n. If so block 826 zero fills the remaining bits. When the outcome of decision block 824 is negative the decoding process terminates.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A method of encoding a binary sequence comprising:
   selecting at least a first portion of said binary sequence to be coded using combinatorial coding, wherein said first portion is selected such that a ratio of one-valued bits to a number of bits in said first portion satisfies at least one bound;
   selecting at least a second portion of said binary sequence to be coded using range coding;
   coding said first portion using combinatorial coding to obtain an combinatorial code; and
   coding said second portion using range coding to obtain an arithmetic code,
   wherein said at least one bound is altered after initially identifying a beginning of said first portion.

2. The method of encoding according to claim 1 further comprising:
   adding said range code to said combinatorial code.

3. The method according to claim 1 wherein said range coding comprises arithmetic coding and said combinatorial coding comprises factorial pulse coding.

4. A method of encoding a binary sequence comprising:
   selecting at least a first portion of said binary sequence to be coded using combinatorial coding;
   selecting at least a second portion of said binary sequence to be coded using range coding:
   coding said first portion using combinatorial coding to obtain a combinatorial code; and
   coding said second portion using range coding to obtain an arithmetic code,
   wherein coding said second portion using range coding comprises scaling down a range code generated by said range coding by applying an initial probability.

5. The method according to claim 4 wherein said initial probability is given by an approximation of a combinatorial function of a number of one bits and a total number of bits in a remaining bit sequence portion that includes said first portion, wherein said approximation of said combinatorial function is also used in said combinatorial coding.

6. A method of decoding a combined arithmetic/factorial pulse code, the method comprising:
   (a) using a known number of ones represented in said combined arithmetic/factorial pulse code, iteratively evaluating an approximation of a combinatorial function using different postulated positions of a last one in order to determine a postulated position that yields a largest value that is less than said combined arithmetic/factorial pulse code;
   (b) subtracting said largest value from said combined arithmetic/factorial pulse code to obtain a first remaining code value;
   (c) testing if a ratio of a remaining number of one bits to a remaining total number of bits satisfies a bound for regulating transitioning from factorial pulse coding to arithmetic coding;
   (d) when said bound for regulating transitioning between factorial pulse coding and arithmetic coding is satisfied decoding at least a portion of said remaining code value using arithmetic decoding;
   (e) after each bit is decoded using arithmetic decoding testing if a bound for regulating transitioning from arithmetic coding to factorial pulse coding is satisfied;
   (f) when said bound for regulating transitioning from arithmetic coding to factorial pulse coding is satisfied selecting a second remaining code value and returning to step (a); and
   (g) ceasing when said combined arithmetic/factorial pulse code is fully decoded.

7. A method of encoding a pulse vector comprising:
   using arithmetic encoding, generating at least one arithmetic code component to represent at least one item of information selected from the group consisting of: a set of locations of a set of non-zero pulses and a set of pulse magnitudes of said set of non-zero pulses; and
   combining said at least one arithmetic code component using a factorial pulse coding code combining formula.

8. The method of encoding according to claim 7 wherein said factorial pulse coding code combining formula is:

$$C=C_v+(P(n,v)C_\mu+C_\pi)2^v+C_\sigma$$

where, v is a number of non-zero pulses;

P(n,v) is an initial probability;

$C\mu$ is a code component representing pulse magnitudes of said non-zero pulses;

$C\pi$ is a code component representing locations of said non-zero pulses;

$C\sigma$ is a code component representing signs of said non-zero pulses;

Cv is a code component representing a number of non-zero pulses, n is the length of a binary sequence.

9. The method of encoding according to claim 8 wherein $C\pi$ is an arithmetic codeword.

10. The method of encoding according to claim 9 wherein using arithmetic encoding comprises reducing an initial position in an AC code space by applying a leading factor.

11. The method of claim 10 wherein the initial position in the AC code space is based on an upper bound on a number of extra bits to be used for AC with finite fixed precision length.

12. The method of claim 10 wherein the initial position in the AC code space is a function of an approximate combinatorial function.

13. The method of claim 8 wherein $C\pi$ is determined by combinatorial coding when a ratio of a number of non-zero pulse to a total number of pulse positions satisfies a predetermined bound.

14. The method of encoding according to claim 8 wherein $C\mu$ is an arithmetic codeword.

15. The method of claim 8 wherein $C\mu$ is selectively determined by combinatorial coding or arithmetic coding depending on how a ratio of one-bits to total bits in a binary vector representing said pulse magnitudes compares to at least one bound.

16. A method of decoding comprising:
receiving a codeword representing an integer pulse sequence;
decoding a number of non-zero positions in said integer pulse sequence based on said codeword
comparing a ratio of said number of non-zero positions to a total number of positions in said integer pulse sequence to a bound;
selectively decoding said codeword using arithmetic coding or combinatorial coding based on an outcome of said comparing wherein, when decoding said codeword using arithmetic coding, using a combinatorial function to generate an initial code space position.

* * * * *